United States Patent
Choi et al.

(10) Patent No.: US 9,263,711 B2
(45) Date of Patent: Feb. 16, 2016

(54) ORGANIC LIGHT-EMITTING DISPLAY DEVICE AND METHOD OF MANUFACTURING THE SAME

(71) Applicant: Samsung Display Co., Ltd., Yongin-si, Gyeonggi-do (KR)

(72) Inventors: Jun-Ho Choi, Yongin-si (KR); Jin-Koo Chung, Yongin-si (KR); Seong-Min Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/663,215

(22) Filed: Mar. 19, 2015

(65) Prior Publication Data

US 2015/0194638 A1 Jul. 9, 2015

Related U.S. Application Data

(62) Division of application No. 13/738,938, filed on Jan. 10, 2013, now Pat. No. 8,994,010.

(30) Foreign Application Priority Data

Jun. 11, 2012 (KR) ........................ 10-2012-0062347

(51) Int. Cl.

| H01L 51/00 | (2006.01) |
|---|---|
| H01L 51/40 | (2006.01) |
| H01L 29/08 | (2006.01) |
| H01L 51/56 | (2006.01) |
| H01L 51/50 | (2006.01) |
| H01L 27/32 | (2006.01) |
| H01L 51/52 | (2006.01) |

(52) U.S. Cl.
CPC ............ *H01L 51/56* (2013.01); *H01L 27/3244* (2013.01); *H01L 51/0021* (2013.01);

(Continued)

(58) Field of Classification Search
CPC ............ H01L 51/5212; H01L 51/5228; H01L 27/3244; H01L 2227/323; H01L 2227/326
USPC ......................................... 438/99, 34; 257/40
See application file for complete search history.

(56) References Cited

U.S. PATENT DOCUMENTS 8,193,017 B2   6/2012 Kim et al.
2006/0255725 A1* 11/2006 Kim .................... H01L 27/3209
                                                              313/506

(Continued)

FOREIGN PATENT DOCUMENTS

| KR | 10-2011-0103735 | 9/2011 |
| KR | 10-2012-0044876 | 5/2012 |
| KR | 10-2012-0134464 | 12/2012 |

OTHER PUBLICATIONS

EPO Search Report dated Oct. 6, 2015, for corresponding European Patent application 13160251.8, (9 pages).

*Primary Examiner* — Julio J Maldonado
*Assistant Examiner* — Moazzam Hossain
(74) *Attorney, Agent, or Firm* — Lewis Roca Rothgerber Christie LLP

(57) ABSTRACT

An organic light-emitting display device and a method of manufacturing the organic light-emitting display device are provided. The organic light-emitting display device includes a plurality of pixels each including: a first region including a light-emitting region for emitting light, a first electrode and an emission layer covering the first electrode being located in the light-emitting region; and a second region including a transmissive region for transmitting external light through the display device. The display device also includes: a third region between the pixels; a first auxiliary layer in the first and third regions; a second electrode on the first auxiliary layer in the first and third regions; a second auxiliary layer covering the second electrode and located in the first and second regions and not in the third region; and a third electrode on the second electrode in the third region.

17 Claims, 9 Drawing Sheets

(52) U.S. Cl.
CPC ........ *H01L51/5008* (2013.01); *H01L 51/5262*
(2013.01); *H01L 51/5206* (2013.01); *H01L 51/5234* (2013.01); *H01L 2227/323* (2013.01)

(56) References Cited

U.S. PATENT DOCUMENTS

| | | | | |
|---|---|---|---|---|
| 2007/0170841 A1* | 7/2007 | Li | ........................ | H01L 51/5281 313/503 |
| 2008/0128686 A1* | 6/2008 | Kwon | ................ | H01L 51/5206 257/40 |
| 2009/0200936 A1* | 8/2009 | Kang | ................... | H01L 51/5203 313/505 |
| 2009/0315458 A1* | 12/2009 | Choi | ................... | H01L 27/3276 313/505 |
| 2010/0327268 A1* | 12/2010 | Kubota | ............... | H01L 51/5048 257/40 |
| 2011/0220922 A1 | 9/2011 | Kim et al. | | |
| 2012/0001184 A1 | 1/2012 | Ha et al. | | |
| 2012/0104422 A1 | 5/2012 | Lee et al. | | |
| 2012/0313099 A1 | 12/2012 | Chung et al. | | |

* cited by examiner

ORGANIC LIGHT-EMITTING DISPLAY DEVICE AND METHOD OF MANUFACTURING THE SAME

CROSS-REFERENCE TO RELATED PATENT APPLICATION

This application is a divisional of U.S. patent application Ser. No. 13/738,938, filed Jan. 10, 2013, which claims priority to and the benefit of Korean Patent Application No. 10-2012-0062347, filed Jun. 11, 2012, the entire content of both of which is incorporated herein by reference.

BACKGROUND

1. Field

Aspects of embodiments of the present invention relate to an organic light-emitting display device and a method of manufacturing the organic light-emitting display device.

2. Description of the Related Art

Organic light-emitting display devices are self-emitting display devices that electrically excite organic compounds to emit light. Organic light-emitting display devices have drawn attention as next-generation display devices capable of resolving problems that have been pointed out in liquid crystal display devices because organic light-emitting display devices may be driven at lower voltages, may be more easily made thin, may have wider viewing angles, and may have faster response speeds when compared to liquid crystal display devices.

It may be possible to produce a transparent organic light-emitting display device by forming a light-transmitting portion in an area other than an area including a thin film transistor or an organic light-emitting device. This may require performing a patterning process so that a cathode formed using an opaque metal is not formed in the light-transmitting portion. However, forming an opening pattern in a cathode, which may be a common electrode, makes it difficult to use a fine metal mask that is often used in a conventional patterning process. In addition, when a common electrode cathode covers all the pixels, wiring resistance may be increased.

SUMMARY

Embodiments of the present invention provide for an organic light-emitting display device having simplified formation of an opening pattern of a common electrode, and decreased wiring resistance of the common electrode. Further embodiments of the present invention provide for a method of manufacturing such an organic light-emitting display device.

According to an exemplary embodiment of the present invention, an organic light-emitting display device is provided. The display device includes a plurality of pixels each including: a first region including a light-emitting region for emitting light, a first electrode and an emission layer covering the first electrode being located in the light-emitting region; and a second region including a transmissive region for transmitting external light through the display device. The display device also includes: a third region between the pixels; a first auxiliary layer in the first and third regions; a second electrode on the first auxiliary layer in the first and third regions; a second auxiliary layer covering the second electrode and located in the first and second regions and not in the third region; and a third electrode on the second electrode in the third region.

The second electrode may not be in the second region.
The first auxiliary layer may not be in the second region.

The second electrode may be in the second region. A thickness of the second electrode in the second region may be less than a thickness of the second electrode in the first region.

The third electrode may be in the second region. A thickness of the third electrode in the second region may be less than a thickness of the third electrode in the third region.

The first auxiliary layer may be in the second region.

The display device may further include a third auxiliary layer in the second region between the first auxiliary layer and the second auxiliary layer.

The third auxiliary layer may not be located in the first and third regions.

The third auxiliary layer may include at least one selected from the group consisting of N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole), m-MTDATA, α-NPD, and TPD.

The second electrode may be in the second region. A thickness of the second electrode in the second region may be less than a thickness of the second electrode in the first region.

The third electrode may be in the second region. A thickness of the third electrode in the second region may be less than a thickness of the third electrode in the third region.

A thickness of the third electrode may be greater than that of the second electrode.

Adhesion of the second electrode in the first and third regions may be greater than adhesion of the second electrode in the second region.

Adhesion of the third electrode in the first and second regions may be lower than adhesion of the third electrode in the third region.

The first auxiliary layer may include at least one selected from tris(8-hydroxy-quinolinato)aluminum (Alq3), di-tungsten tetra(hexahydropyrimidopyrimidine), fullerene, lithium fluoride (LiF), 9,10-di(naphth-2-yl)anthracene (AND), and 8-hydroxyquinolinolato-lithium (Liq).

The second auxiliary layer may include at least one selected from N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole), 4,4,4-tris(3-methylphenylphenylamino)triphenylamine (m-MTDATA), N,N'-bis(1-naphthyl)-N,N'-diphenyl[1,1'-biphenyl]-4,4'-diamine (α-NPD), and 4,4'-Bis[N-(3-methylphenyl)-N-phenylamino]biphenyl (TPD).

The second electrode and the third electrode may include magnesium (Mg).

According to another exemplary embodiment of the present invention, a method of manufacturing an organic light-emitting display device is provided. The method includes: defining a plurality of pixels each including a first region including a light-emitting region for emitting light, and a second region including a transmissive region for transmitting external light through the display device; defining a third region located between the pixels; forming a first electrode in the light-emitting region of each pixel; forming an emission layer covering the first electrode; forming a first auxiliary layer in the first and third regions; forming a second electrode by depositing a metal for forming the second electrode on the first auxiliary layer in the first and third regions; forming a second auxiliary layer covering the second electrode and located in the first and second regions and not in the third region; and forming a third electrode on the second electrode by depositing a metal for forming the third electrode in the third region.

The forming of the second electrode may include: depositing the metal for forming the second electrode in the first, second, and third regions; and not forming the second electrode in the second region.

The forming of the first auxiliary layer may include patterning the first auxiliary layer in the first and third regions and not in the second region.

The forming of the second electrode may include: depositing the metal for forming the second electrode in the first, second, and third regions; and forming the second electrode in the second region. A thickness of the second electrode in the second region may be less than a thickness of the second electrode in the first region.

The forming of the third electrode may include: depositing a metal for forming the third electrode in the first, second, and third regions; and forming the third electrode in the second region. A thickness of the third electrode in the second region may be smaller than a thickness of the third electrode in the third region.

The forming of the first auxiliary layer may include forming the first auxiliary layer in the second region.

The method may further include forming a third auxiliary layer in the second region between the first auxiliary layer and the second auxiliary layer.

The forming of the third auxiliary layer may include patterning the third auxiliary layer in the second region and not in the first and third regions.

The third auxiliary layer may include at least one selected from N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole), m-MTDATA, α-NPD, and TPD.

The forming of the second electrode may include: depositing the metal for forming the second electrode in the first, second, and third regions; and forming the second electrode in the second region. A thickness of the second electrode in the second region may be less than a thickness of the second electrode in the first region.

The forming of the third electrode may include: depositing the metal for forming the third electrode in the first, second, and third regions; and forming the third electrode in the second region. A thickness of the third electrode in the second region may be less than a thickness of the third electrode in the third region.

The third electrode may be formed thicker than the second electrode.

Adhesion of the second electrode in the second region may be lower than adhesion of the second electrode in the first and third regions.

Adhesion of the third electrode in the first and second regions may be lower than adhesion of the third electrode in the third region.

The first auxiliary layer may include at least one selected from tris(8-hydroxy-quinolinato)aluminum (Alq3), di-tungsten tetra(hexahydropyrimidopyrimidine), fullerene, lithium fluoride (LiF), 9,10-di(naphth-2-yl)anthracene (AND), and 8-hydroxyquinolinolato-lithium (Liq).

The second auxiliary layer may include at least one selected from N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole), 4,4,4-tris(3-methylphenylphenylamino)triphenylamine (m-MTDATA), N,N'-bis(1-naphthyl)-N,N'-diphenyl[1,1'-biphenyl]-4,4'-diamine (α-NPD), and 4,4'-Bis[N-(3-methylphenyl)-N-phenylamino]biphenyl (TPD).

The metal for forming the second electrode and the metal for forming the third electrode may include magnesium (Mg).

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Now, exemplary embodiments according to the present invention will be described in detail with reference to the accompanying drawings. As used herein, the term "and/or" includes any and all combinations of one or more of the associated listed items. Expressions such as "at least one of," when preceding a list of elements, modify the entire list of elements and do not modify the individual elements of the list.

Figure 1:
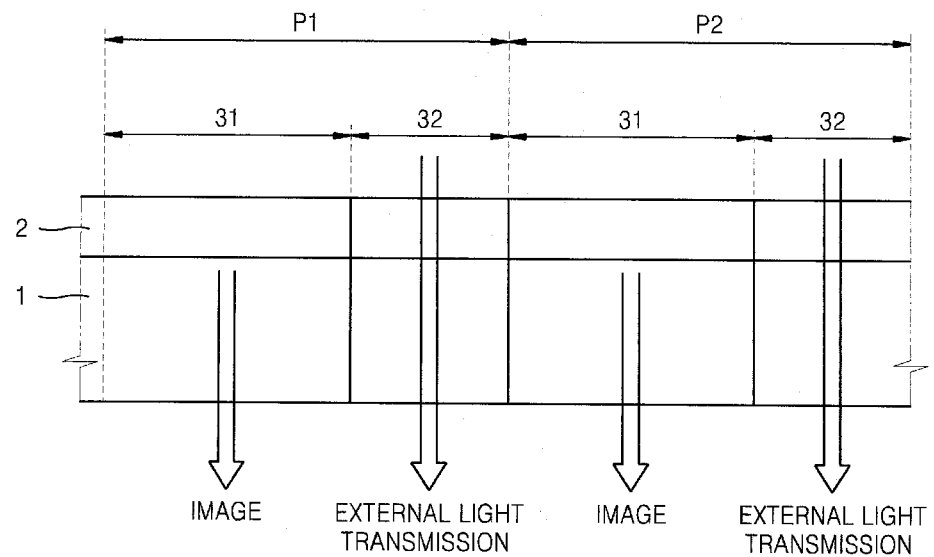
FIG. 1 is a schematic cross-sectional view of an organic light-emitting display device according to an embodiment of the present invention.

FIG. 1 is a schematic cross-sectional view of an organic light-emitting display device according to an embodiment of the present invention.

Referring to FIG. 1, the organic light-emitting display device includes a substrate 1 and a display unit 2 formed on the substrate 1. In the organic light-emitting display device, external light penetrates the substrate 1 and the display unit 2. For example, external light enters one side of the organic light-emitting display device, transmits through the display unit 2 and the substrate 1, and exits another side of the organic light-emitting display device. That is, the display unit 2 is formed to transmit external light (e.g., is transparent), as described in more detail below. As depicted in FIG. 1, the display unit 2 is formed so that a user viewing an image displayed on the organic light-emitting display device may also view an external light transmission (for example, a scene behind the organic light-emitting display device) transmitted through the substrate 1 and the display unit 2.

FIG. 1 shows a first pixel P1 and a second pixel P2 that are disposed (for example, located) adjacent to each other in the organic light-emitting display device. Each of the first and second pixels P1 and P2 includes a first region 31 and a second region 32. An image is displayed by the display unit 2 through the first region 31 while external light penetrates (i.e., transmits through) the second region 32. In other words, both the first and second pixels P1 and P2 include the first region 31 to display an image and the second region 32 through which external light penetrates and thus, a user may see an external scene (i.e., behind the organic light-emitting display device) through the second region 32 in addition to or in place of when the user sees the image displayed in the first region 31.

In this regard, transmittance of the external light may be significantly increased by not forming devices such as a thin film transistor, a capacitor, or an organic light-emitting device in the second region 32. That is, by forming devices such as thin film transistors, capacitors, and organic light-emitting devices in the first region 31 and not in the second region 32, distortion or other degradation of the transmitted external light due to interference by such devices may be reduced or prevented as much as possible.

Figure 2:
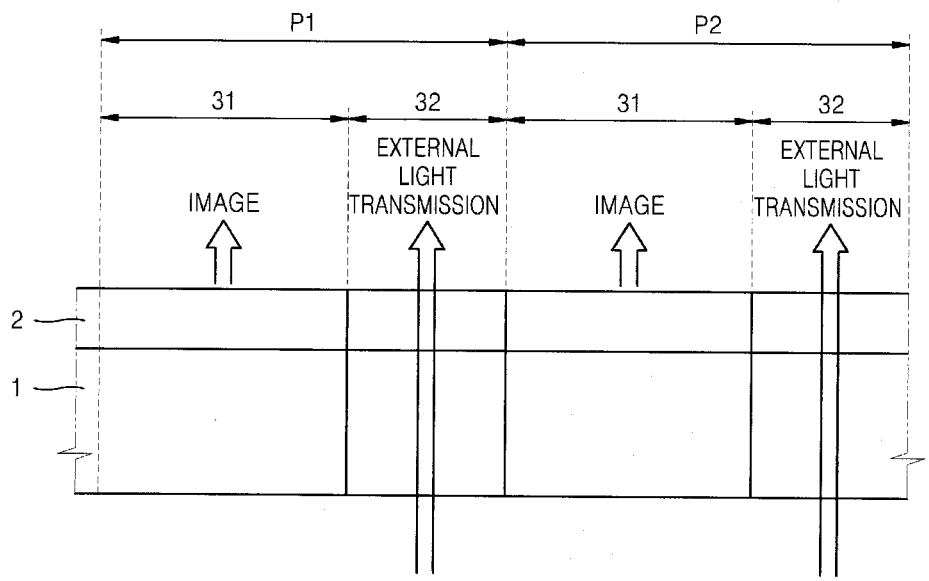
FIG. 2 is a schematic cross-sectional view of an organic light-emitting display device according to another embodiment of the present invention.
Figure 3:
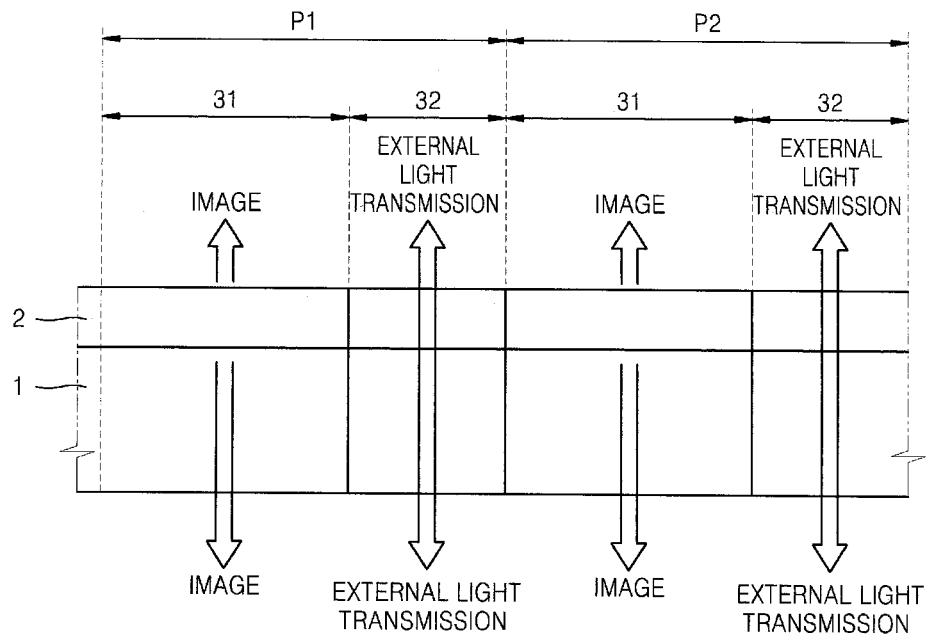
FIG. 3 is a schematic cross-sectional view of an organic light-emitting display device according to another embodiment of the present invention.

Although FIG. 1 shows a bottom emission-type light-emitting display device in which an image of the display unit 2 is displayed toward the substrate 1, the present invention is not limited thereto. As shown in FIG. 2, embodiments of the present invention may be used in a top emission-type light-emitting display device in which the image of the display unit 2 is displayed away from the substrate 1. In addition, as shown in FIG. 3, embodiments of the present invention may be used in a two-sided light-emitting display device in which the image of the display unit 2 is displayed both toward and away from the substrate 1.

Figure 4:
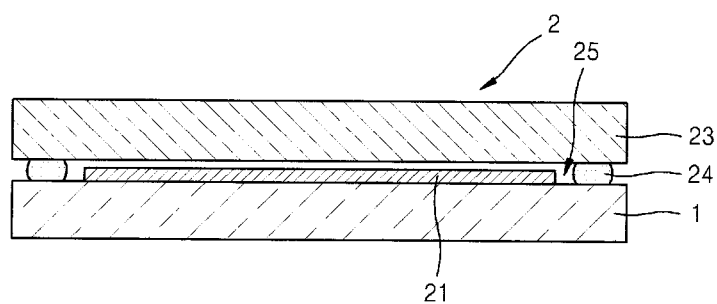
FIG. 4 is a detailed cross-sectional view of an organic light-emitting display device according to an embodiment of the present invention.
Figure 5:
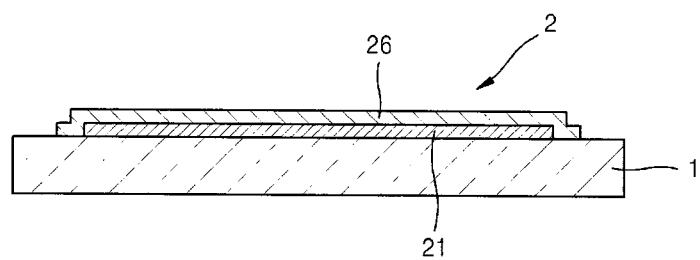
FIG. 5 is a detailed cross-sectional view of an organic light-emitting display device according to another embodiment of the present invention.

The above-described embodiments of the organic light-emitting display device may be embodied in further detail as shown in FIG. 4 and/or FIG. 5.

Referring to FIG. 4, the display unit 2 includes an organic light-emitting unit 21 formed on the substrate 1 and a sealing substrate 23 for sealing the organic light-emitting unit 21. The sealing substrate 23 is formed of a transparent member to display an image from the organic light-emitting unit 21 and reduces or prevents external air and moisture from entering the organic light-emitting unit 21. Edges of the substrate 1 and the sealing substrate 23 are coupled to each other via a sealing material 24 to seal a space 25 between the substrate 1 and the sealing substrate 23. A moisture absorbent, a filling material, or the like may be located in the space 25.

As shown in FIG. 5, a sealing film 26 formed thin, instead of the sealing substrate 23, may be formed on the organic light-emitting unit 21 to protect the organic light-emitting unit 21 against external air or moisture. The sealing film 26 may have a structure in which a film formed of an inorganic material, such as silicon oxide or silicon nitride, and a film formed of an organic material, such as epoxy or polyimide, are alternately formed, but the present invention is not limited thereto. That is, any transparent thin film having a sealing structure may be used as the sealing film 26.

Figure 6:
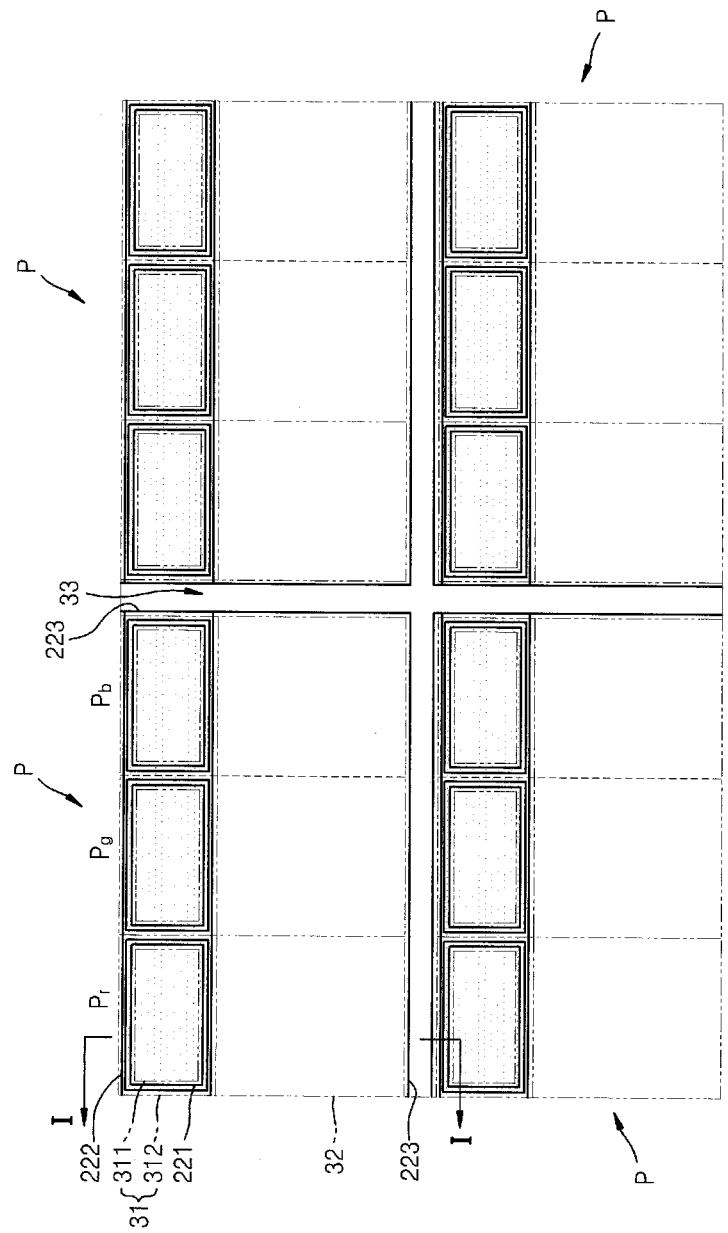
FIG. 6 is a plan view showing adjacent pixels of an organic light-emitting display device according to an embodiment of the present invention.
Figure 7:
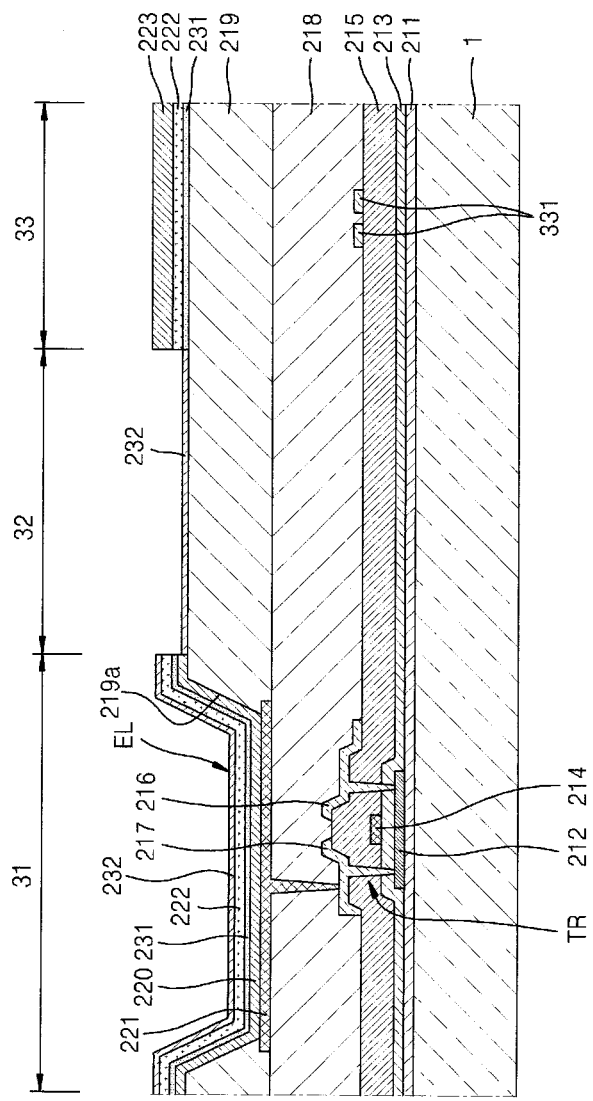
FIG. 7 is a cross-sectional view taken along line I-I of FIG. 6 according to an embodiment of the present invention.

FIG. 6 is a plan view showing pixels P of an organic light-emitting display device according to an embodiment of the present invention. FIG. 7 is a cross-sectional view taken along line I-I of FIG. 6 according to an embodiment of the present invention. Each pixel P may include a red pixel Pr, a green pixel Pg, and a blue pixel Pb that are disposed adjacent to one another.

Each of the red pixel Pr, the green pixel Pg, and the blue pixel Pb includes a circuit region 311 and a light-emitting region 312 in the first region 31. In the embodiment of FIGS. 6-7, the circuit region 311 and the light-emitting region 312 are disposed to overlap with each other. The light-emitting region 312 includes a first electrode 221 that may be disposed to overlap with the circuit region 311.

The second region 32, including a transmissive region for transmitting external light, is disposed adjacent to the first region 31. Although the transmissive region corresponds to the second region 32 in FIG. 6, the present invention is not limited thereto. In addition, in FIG. 6, the second region 32 is formed wider than the first region 31 to include the transmissive region.

The second regions 32 may be independently formed in the red, green, and blue pixels Pr, Pg, and Pb or may be formed to be connected to one another across the red, green, and blue pixels Pr, Pg, and Pb. In other words, one pixel P includes the red pixel Pr, the green pixel Pg, and the blue pixel Pb. In this regard, one pixel P may include the second region 32 and thus, the second region 32 may be formed across the red pixel Pr, the green pixel Pg, and the blue pixel Pb. In this case, since an area of the second region 32 for transmitting external light may be extended, transmittance of the entire display unit 2 may be increased.

A second electrode 222 is disposed in the first region 31. As with the second region 32, one pixel P may include the second electrode 222 and thus, the second electrode may be formed across the red pixel Pr, the green pixel Pg, and the blue pixel Pb.

A third region 33 is located between the pixels P. A third electrode 223 is located in the third region 33. At least one wiring line 331 may be located in the third region 33, as shown in FIG. 7. The wiring line 331 may be electrically connected to a pixel circuit unit to be described below.

Each circuit region 311 includes a pixel circuit unit including a thin film transistor TR, as shown in FIG. 7. However, the present invention is not limited thereto, and the pixel circuit unit may further include a plurality of thin film transistors TR and one or a plurality of storage capacitors. The pixel circuit unit may further include a plurality of wiring lines, such as scan lines, data lines, and Vdd lines, connected to the thin film transistors TR and the storage capacitors.

Each light-emitting region 312 may include an organic light-emitting diode EL that is a luminous element. The organic light-emitting diode EL is electrically connected to the thin film transistor TR of the pixel circuit unit.

A buffer layer 211 is formed on the substrate 1, and the pixel circuit unit, including the thin film transistor TR, is formed on the buffer layer 211. A semiconductor active layer 212 is formed on the buffer layer 211. The buffer layer 211 is formed of a transparent insulating material, and also may be formed of any of various other materials capable of reducing or preventing penetration of impurity substances and of planarizing a surface of the substrate 1. For example, the buffer layer 211 may be formed of an inorganic material such as silicon oxide, silicon nitride, silicon oxynitride, aluminum oxide, aluminum nitride, titanium oxide, or titanium nitride, an organic material such as polyimide, polyester, or acryl, or a stack of inorganic and organic materials. In other embodiments, the buffer layer 211 may not be formed.

The semiconductor active layer 212 may be formed of polycrystalline silicon. However, the present invention is not limited thereto, and the semiconductor active layer 212 may be formed of an oxide semiconductor. For example, the semiconductor active layer 212 may be a G-I-Z—O layer [(In$_2$O$_3$)a(Ga$_2$O$_3$)b(ZnO)c layer] (a, b, and c are real numbers satisfying conditions a≥0, b≥0, and c>0, respectively). When the semiconductor active layer 212 is formed of an oxide semiconductor, light transmittance in the circuit region 311 of the first region 31 may further be increased and thus, transmittance of external light of the entire display unit 2 may be increased.

A gate insulating layer 213 is formed on the buffer layer 211 to cover the semiconductor active layer 212. A gate electrode 214 is formed on the gate insulating layer 213. An insulating interlayer 215 is formed on the gate insulating layer 213 to cover the gate electrode 214. A source electrode 216 and a drain electrode 217 are formed on the insulating interlayer 215 to contact the semiconductor active layer 212 via contact holes. In other embodiments, the structure of the thin film transistor TR is not limited thereto, and a thin film transistor TR having any of various other structures may be used.

A first insulating layer 218 is formed to cover the thin film transistor TR. The first insulating layer 218 may be an insulating layer having a single-layered or multi-layered structure with a planarized top surface. The first insulating layer 218 may be formed of an inorganic material and/or an organic material.

The first electrode 221 of the organic light-emitting diode EL is electrically connected to the thin film transistor TR and is formed on the first insulating layer 218, as shown in FIG. 7. The first electrode 221 is formed into an island shape that is independently formed in each pixel.

A second insulating layer 219 is formed on the first insulating layer 218 to cover an edge of the first electrode 221. An opening 219a is formed in the second insulating layer 219 to expose a center portion, other than the edge, of the first electrode 221. The second insulating layer 219 may be formed of an organic material such as acryl or polyimide.

An EL layer 220 is formed on the first electrode 221 exposed by the opening 219a. The second electrode 222 is formed to cover the EL layer 220, thereby completing the formation of the organic light-emitting diode EL. The EL layer 220 may be a low-molecular organic layer or a polymer organic layer. When the EL layer 220 is a low-molecular organic layer, a hole injection layer (HIL), a hole transport layer (HTL), an emission layer (EML), an electron transport layer (ETL), and an electron injection layer (EIL) may be stacked as a multi-layered structure. These low-molecular organic layers may be formed by using a vacuum evaporation method.

The EML is formed in each of the red, green, and blue pixels. The other layers, for example, the HIL, the HTL, the ETL, the EIL, etc., are common layers and may be commonly used and/or formed in the red, green, and blue pixels. Although the EL layer 220 is patterned to be located only in the first region 31 in FIG. 7, the present invention is not limited thereto. In addition, although not shown in the drawing, the common layers such as the HIL, the HTL, the ETL, and the EIL may be located in the second region 32 and/or the third region 33, and this may also be applied to all subsequently described embodiments.

The HIL may be formed of phthalocyanine compounds such as copper phthalocyanine (CuPc), or TCTA, 4,4,4-tris(3-methylphenylphenylamino)triphenylamine (m-MTDATA), or m-MTDAPB, which is a starburst amine-based material. The HTL may be formed of, for example, 4,4'-Bis[N-(3-methylphenyl)-N-phenylamino]biphenyl (TPD), N,N'-bis(1-naphthyl)-N,N'-diphenyl[1,1'-biphenyl]-4,4'-diamine (α-NPD), or the like. The EIL may be formed of, for example, LiF, NaCl, CsF, Li$_2$O, BaO, Liq, or the like. The ETL may be formed of, for example, Alq3.

The EML may include a host material and a dopant material. Examples of the host material may include tris(8-hydroxy-quinolinato)aluminum (Alq3), 9,10-di(naphth-2-yl)anthracene (AND), 2-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-di(4-methylphenyl-ethene-1-yl)-biphenyl (p-DMDPVBi), etc. Examples of the dopant material may include 4,4'-bis[4-(di-p-tolylamino)styryl]biphenyl (DPAVBi), 9,10-di(naph-2-tyl)anthracene (ADN), 2-tert-butyl-9,10-di(naph-2-tyl)anthracene (TBADN), etc.

The first electrode 221 may serve as an anode and the second electrode 222 may serve as a cathode, or vice-versa. When the first electrode 221 serves as an anode, the first electrode 221 may be formed of a high-work function material, for example, indium tin oxide (ITO), indium zinc oxide (IZO), zinc oxide (ZnO), In$_2$O$_3$, etc. In FIG. 7, if the organic light-emitting display device is a top emission-type light-emitting display device in which an image is displayed away from the substrate 1, the first electrode 221 may further include a reflection layer (not shown) formed of silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), cobalt (Co), samarium (Sm), or calcium (Ca).

When the second electrode 222 serves as a cathode, the second electrode 222 may be formed of a metal such as Ag, Mg, Al, Pt, Pd, Au, Ni, Nd, Ir, Cr, Li, Yb, Co, Sm, or Ca. In FIG. 7, if the organic light-emitting display device is a bottom emission-type light-emitting display device in which an image is displayed toward the substrate 1, the second electrode 222 may be formed of a material having light transmittance. For this, the second electrode 222 may be formed as a thin film using Mg and/or a Mg alloy. Unlike the first electrode 221, the second electrode 222 may be formed as a common electrode to apply a common voltage to all the pixels P.

When the second electrode 222 is a common electrode that applies a common voltage to all the pixels P, a surface resistance of the second electrode 222 is increased and thus, a voltage drop may occur. To address this problem, the third electrode 223 may further be formed to be electrically connected to the second electrode 222. The third electrode 223 may be formed of a metal such as Ag, Mg, Al, Pt, Pd, Au, Ni, Nd, Ir, Cr, Li, Yb, Co, Sm, or Ca. In addition, the third electrode 223 may be formed of the same material used for forming the second electrode 222.

According to the embodiment shown in FIG. 7, a first auxiliary layer 231 is formed on the EL layer 220 and the second insulating layer 219 before forming the second electrode 222. The first auxiliary layer 231 is formed only in the first region 31 and the third region 33 and not in the second region 32, which is a region for transmitting light, by deposition using a mask (not shown).

The first auxiliary layer 231 may be formed of a material that may bond well to the metal for forming the second electrode 222 (in particular, Mg and/or a Mg alloy) formed on the first auxiliary layer 231. For example, the first auxiliary layer 231 may include Alq3, di-tungsten tetra(hexahydropyrimidopyrimidine), fullerene, lithium fluoride (LiF), 9,10-di 2-naphthyl)anthracene (ADN), or 8-hydroxyquinolinatolithium (Liq). The first auxiliary layer 231 is patterned to be formed only in the first region 31 and the third region 33 and not in the second region 32, and then is formed on the EL layer 220 (in the first region 31) and the second insulating layer 219 (in the third region 33), and then the second electrode 222 is formed.

The second electrode 222 may be formed by commonly depositing a metal for forming the second electrode 222 on all the pixels P including the first to third regions 31 to 33 by using an open mask. In this regard, as described above, the second electrode 222 is formed into a thin film to be a semi-permeable reflection film (e.g., a semi-transparent and semi-reflective film). As such, if the metal for forming the second electrode 222 is commonly deposited on all the pixels P by using an open mask, the metal for forming the second electrode 222 is deposited on the first auxiliary layer 231 (e.g., in the first and third regions 31 and 33) and the second insulating layer 219 (e.g., in the second region 32). Also, if the EL layer 220 includes a common layer, the metal for forming the second electrode 222 may be deposited on the common layer constituting the EL layer 220, in particular, an EIL (not shown), instead of being deposited on the second insulating layer 219.

In this regard, the second electrode 222 may be formed only on the first auxiliary layer 231 instead of being formed on the second insulating layer 219 exposed in the second region 32 and/or on the common layer constituting the EL layer 220, as shown in FIG. 7, by allowing the metal for forming the second electrode 222 to be deposited favorably on the first auxiliary layer 231 and to be deposited unfavorably on the second insulating layer 219 and/or the common layer. In other words, since adhesion of the second electrode 222 with respect to the first and third regions 31 and 33 is greater than adhesion of the second electrode 222 with respect to the second region 32, and since the second electrode 222 is formed into a thin film, the second electrode 222 is formed only in the first region 31 and the third region 33 and not in the second region 32.

Thus, the second electrode 222 may be easily patterned without using a separate mask for patterning. For this, the second insulating layer 219 and/or the common layer may be formed of a material having low adhesion with respect to the metal for forming the second electrode 222, compared to that of the first auxiliary layer 231. For example, the second insulating layer 219 may be formed of acryl, and the common layer, in particular, the EIL, may be formed of Liq. The second electrode 222 formed in the above-described way is located only in the first region 31 and the third region 33 and not in the second region 32.

Next, a second auxiliary layer 232 is formed in the first region 31 and the second region 32. The second auxiliary layer 232 is formed on the second electrode 222 in the first region 31 and is formed on the second insulating layer 219 in the second region 32 or on the common layer constituting the EL layer 220. The second auxiliary layer 232 may be patterned not to be formed in the third region 33.

The second auxiliary layer 232 may be formed of a material that may not bond well to the metal for forming the third electrode 223 (in particular, Mg and/or a Mg alloy) formed on the second electrode 222. For example, the second auxiliary layer 232 may be formed of a material including N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole), m-MTDATA, α-NPD, or TPD.

The second auxiliary layer 232 serves as a mask when forming the third electrode 223. In other words, when the metal for forming the third electrode 223 is commonly deposited on the first to third regions 31 to 33 by using an open mask after forming the second auxiliary layer 232, the third electrode 223 may not be favorably deposited in the first region 31 and the second region 32 and may be formed only in the third region 33 because the second auxiliary layer 232 is formed in the first region 31 and the second region 32. The third electrode 223 is formed thicker than the second electrode 222, and thus, a voltage drop may be reduced or prevented from occurring in the second electrode 222 for applying a common voltage.

The above-described embodiment has process benefits because the second electrode 222 and the third electrode 223 formed of a metal may be patterned without using a separate mask. In addition, transmittance of an entire panel may be improved by not forming the second electrode 222 and the third electrode 223 in the second region 32 including a transmissive region.

Figure 8:
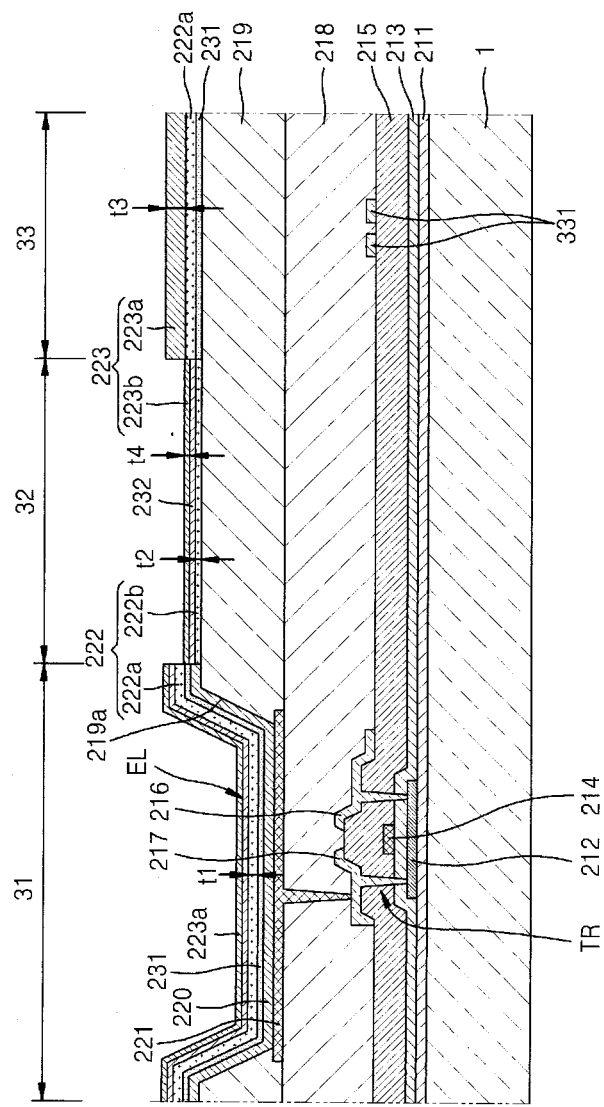
FIG. 8 is a cross-sectional view taken along line I-I of FIG. 6 according to another embodiment of the present invention.

FIG. 8 is a cross-sectional view taken along line I-I of FIG. 7 according to another embodiment of the present invention.

Even though the first auxiliary layer 231 is formed of a material that may bond well to the metal for forming the second electrode 222 (in particular, Mg and/or a Mg alloy) formed on the first auxiliary layer 231, a small amount of metal may be deposited even in a region where the first auxiliary layer 231 is not formed. Thus, when the first auxiliary layer 231 is formed only in the first region 31 and the third region 33 and not in the second region 32, if a metal for forming the second electrode 222 is deposited in the first region 31 to the third region 33 by using an open mask as in the embodiment shown in FIG. 7, the second electrode 222 may be formed in the first region 31 to the third region 33 as shown in FIG. 8. In this regard, a thickness t2 of a portion 222b of the second electrode 222 located in the second region 32 may be smaller than a thickness t1 of a portion 222a of the second electrode 222 located in the first region 31 and the third region 33. For example, the thickness t2 of the second electrode 222 in the second region 32 may be less than the thickness t1 of the second electrode 222 in the first and third regions 31 and 33.

In addition, even though the second auxiliary layer 232 is formed of a material that may not bond well to a metal for forming the third electrode 223 (in particular, Mg and/or a Mg alloy) formed on the second auxiliary layer 232, a small amount of metal may be deposited on the second auxiliary layer 232. Thus, when the second auxiliary layer 232 is formed only in the first region 31 and the second region 32 and not in the third region 33, if a metal for forming the third electrode 223 is deposited in the first region 31 to the third region 33 by using an open mask as in the embodiment shown in FIG. 7, the third electrode 223 may be formed in the first region 31 to the third region 33 as shown in FIG. 8. In this regard, a thickness t4 of a portion 223b of the third electrode 223 located in the first region 31 and the second region 32 may be smaller (for example, much smaller) than a thickness t3 of a portion 223a of the third electrode 223 located in the third region 33.

As such, in the embodiment shown in FIG. 8, the portion 222b of the second electrode 222 formed of a metal and the portion 223b of the third electrode 223 are located in the second region 32, which is a transmissive region. However, in this case, since the portion 222b of the second electrode 222 and the portion 223b of the third electrode 223 are formed relatively thin, transmittance of external light through the second region 32 may not be greatly decreased.

Figure 9:
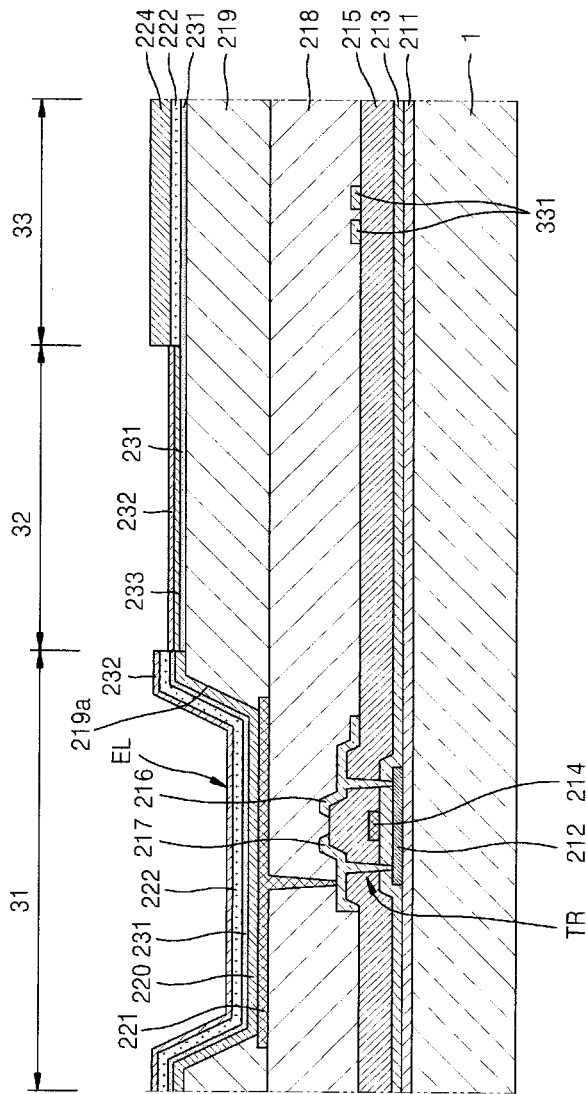
FIG. 9 is a cross-sectional view taken along line I-I of FIG. 6 according to another embodiment of the present invention.

FIG. 9 is a cross-sectional view taken along line I-I of FIG. 6 according to another embodiment of the present invention.

The embodiment shown in FIG. 9 is the same as that shown in FIG. 7 and/or FIG. 8 up to the process of forming of the EL layer 220. At that point, the first auxiliary layer 231 is deposited on the EL layer 220 across the first region 31 to the third region 33. Then, a third auxiliary layer 233 is formed on the first auxiliary layer 231. In this regard, the third auxiliary layer 233 may be located only in the second region 32 by forming the third auxiliary layer 233 using a patterning mask.

The third auxiliary layer 233 may be formed of a material having the same characteristics as the second auxiliary layer 232. In other words, the third auxiliary layer 233 may be formed of a material that may not bond well to the metal for forming the second electrode 222 (in particular, Mg and/or a Mg alloy) formed on the first auxiliary layer 231.

The metal for forming the second electrode 222 is deposited across the first region 31 to the third region 33 by using an open mask after forming the third auxiliary layer 233. Thus, the metal for forming the second electrode 222 is deposited on the first auxiliary layer 231 in the first region 31 and the third region 33 and is deposited on the third auxiliary layer 233 in the second region 32. In this regard, since adhesion between the first auxiliary layer 231 and the metal for forming the second electrode 222 is favorable and adhesion between the third auxiliary layer 233 and the metal for forming the second electrode 222 is unfavorable, the second electrode 222 is formed only in the first region 31 and the third region 33 and not in the second region 32.

Next, the second auxiliary layer 232 is formed on the second electrode 222 and the third auxiliary layer 233. In this regard, the second auxiliary layer 232 may be formed only in the first region 31 and the second region 32 and not in the third region 33 by forming the second auxiliary layer 232 using a patterning mask.

Next, a metal for forming the third electrode 224 is deposited across the first region 31 to the third region 33 by using an open mask. Thus, the metal for forming the third electrode 224 is deposited on the second auxiliary layer 232 in the first region 31 and the second region 32 and on the second electrode 222 in the third region 33. In this regard, since adhesion between the second auxiliary layer 232 and the metal for forming the third electrode 224 is unfavorable, the third electrode 224 is formed only in the third region 33 and not in the first region 31 and the second region 32.

The above-described embodiment has process benefits because the second electrode 222 and the third electrode 224 formed of a metal may be patterned without using a separate mask, and transmittance of an entire panel may be improved by not forming the second electrode 222 and the third electrode 224 in the second region 32 including a transmissive region.

Figure 10:
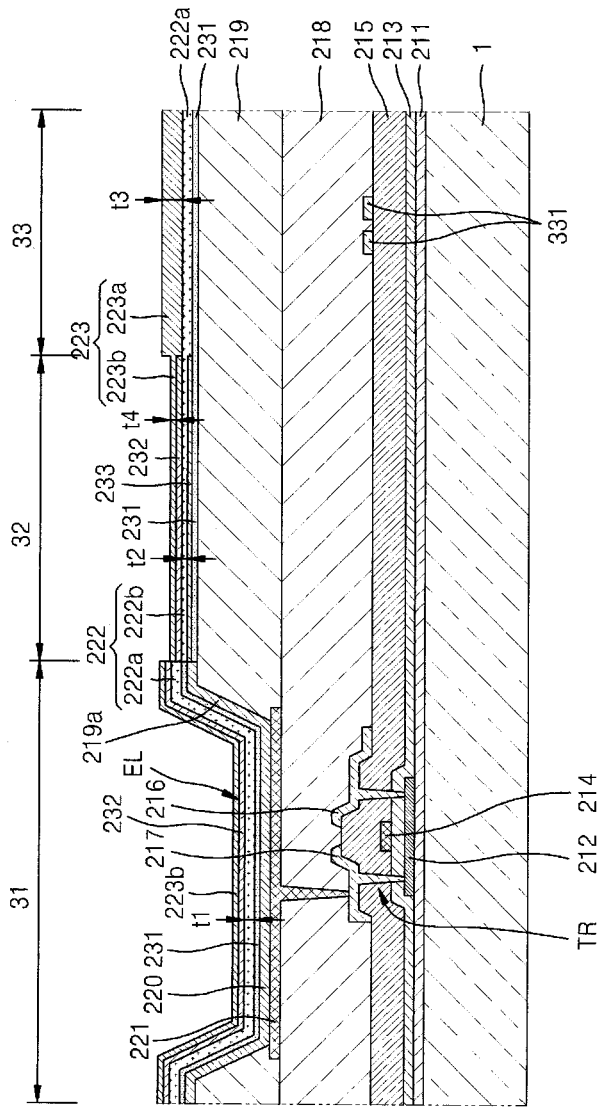
FIG. 10 is a cross-sectional view taken along line I-I of FIG. 6 according to another embodiment of the present invention.

FIG. 10 is a cross-sectional view taken along line I-I of FIG. 9 according to another embodiment of the present invention.

Similar to the second auxiliary layer 232, even though the third auxiliary layer 233 is formed of a material that may not bond well to a metal, in particular, to Mg and/or a Mg alloy, a small amount of metal may be deposited on the third auxiliary layer 233. Thus, when the third auxiliary layer 233 is formed only in the second region 32 and not in the first region 31 and the third region 33, if a metal for forming the second electrode 222 is deposited in the first region 31 to the third region 33 by using an open mask as in the embodiment shown in FIG. 9, the second electrode 222 may be formed in the first region 31 to the third region 33 as shown in FIG. 10. In this regard, the thickness t2 of the portion 222b of the second electrode 222 located in the second region 32 may be smaller (for example, significantly smaller) than the thickness t1 of the portion 222a of the second electrode 222 located in the first region 31 and the third region 33.

In addition, as described above, a small amount of metal may be deposited on the second auxiliary layer 232. Thus, when the second auxiliary layer 232 is formed only in the first region 31 and the second region 32 and not in the third region 33, if a metal for forming the third electrode 223 is deposited in the first region 31 to the third region 33 by using an open mask as in the embodiment shown in FIG. 9, the third electrode 223 may be formed in the first region 31 to the third region 33 as shown in FIG. 10. In this regard, the thickness t4 of the portion 223b of the third electrode 223 located in the first region 31 and the second region 32 may be smaller (for example, significantly smaller) than the thickness t3 of the portion 223a of the third electrode 223 located in the third region 33.

As such, in the embodiment shown in FIG. 10, the portion 222b of the second electrode 222 formed of a metal and the portion 223b of the third electrode 223 are located in the second region 32, which is a transmissive region. However, in this case, since the portion 222b of the second electrode 222 and the portion 223b of the third electrode 223 are formed relatively thin, transmittance of external light through the second region 32 may not be greatly decreased.

In the embodiments shown in FIGS. 6 to 10, since the circuit region 311 overlaps with the light-emitting region 312, the embodiments shown in FIGS. 6 to 10 may be more appropriate for a top emission-type light-emitting display device in which an image is displayed away from the substrate 1. In this case, since the circuit region 311 is covered by the light-emitting region 312, a decrease in transmittance of external light due to the circuit region 311 may be suppressed, and also, a decrease in luminance efficiency of the light-emitting region 312 due to the circuit region 311 may be suppressed.

Figure 11:
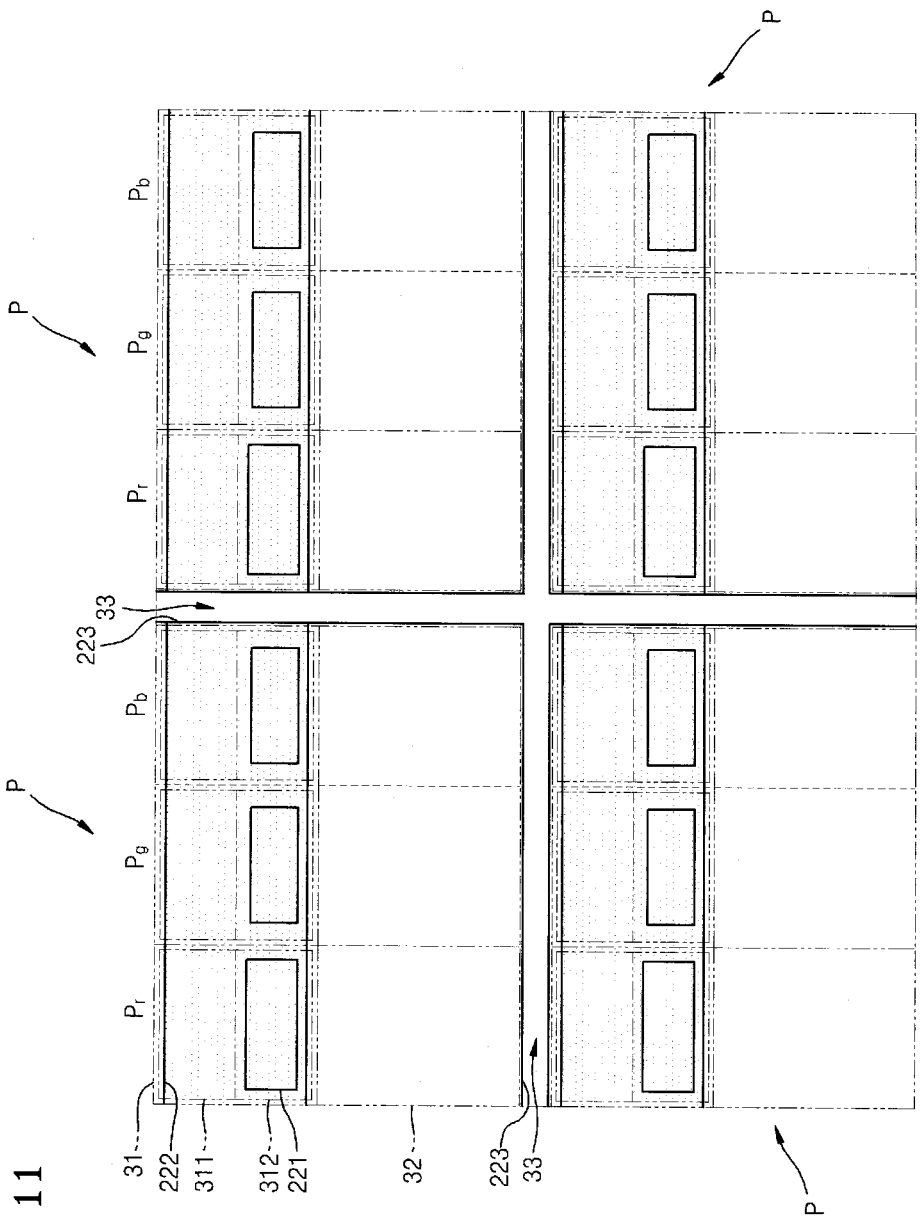
FIG. 11 is a plan view showing adjacent pixels of an organic light-emitting display device according to another embodiment of the present invention.

FIG. 11 is a plan view showing adjacent pixels of an organic light-emitting display device according to another embodiment of the present invention. In FIG. 11, the circuit region 311 does not overlap with the light-emitting region 312 and the first electrode 221. The organic light-emitting display device having a structure shown in FIG. 11 may be appropriate even when the organic light-emitting display device is a bottom emission-type light-emitting display device in which an image emitted from the light-emitting region 312 is displayed toward the substrate 1.

In the organic light-emitting display device having a structure shown in FIG. 11, the light-emitting region 312 is not influenced by the circuit region 311 and thus, luminance efficiency of the light-emitting region 312 may be prevented from being decreased (or any such decreasing can be reduced). However, although not shown in FIG. 11, the circuit region 311 of the first region 31 may at least partially overlap with the third region 33 in the embodiment shown in FIG. 11. Thus, the third electrode 223 formed in the third region 33 may overlap with the circuit region 311. An area of the second auxiliary layer 232 (see FIGS. 7-10) serving as a mask for forming the third electrode 223 may be adjusted to correspond to an area where the third electrode 223 is formed.

In the above-described embodiments, the light-emitting display device is patterned in such a way that only the second electrode 222 has an opening in the second region 32, but the present invention is not limited thereto. The light-emitting display device may be patterned in such a way that at least a part of at least one insulating layer from among insulating layers located in the second region 32 has an opening, and thus, transmittance of external light in the second region 32 may further be increased.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing an organic light-emitting display device, the method comprising:
   defining a plurality of pixels each comprising
   a first region comprising a light-emitting region for emitting light, and
   a second region comprising a transmissive region for transmitting external light through the display device;
   defining a third region located between the pixels;
   forming a first electrode in the light-emitting region of each pixel;
   forming an emission layer covering the first electrode;
   forming a first auxiliary layer in the first and third regions;
   forming a second electrode by depositing a metal for forming the second electrode on the first auxiliary layer in the first and third regions;
   forming a second auxiliary layer covering the second electrode in the first region, the second auxiliary layer further being located in the second region but not in the third region; and
   forming a third electrode on the second electrode by depositing a metal for forming the third electrode in the third region.

2. The method of claim 1, wherein the forming of the second electrode comprises:
   depositing the metal for forming the second electrode in the first, second, and third regions; and
   not forming the second electrode in the second region.

3. The method of claim 1, wherein the forming of the first auxiliary layer comprises patterning the first auxiliary layer in the first and third regions and not in the second region.

4. The method of claim 3, wherein the forming of the second electrode comprises:
   depositing the metal for forming the second electrode in the first, second, and third regions; and
   forming the second electrode in the second region,
   wherein a thickness of the second electrode in the second region is less than a thickness of the second electrode in the first region.

5. The method of claim 3, wherein the forming of the third electrode comprises:
   depositing a metal for forming the third electrode in the first, second, and third regions; and
   forming the third electrode in the second region,
   wherein a thickness of the third electrode in the second region is smaller than a thickness of the third electrode in the third region.

6. The method of claim 1, wherein the forming of the first auxiliary layer comprises forming the first auxiliary layer in the second region.

7. The method of claim 6, further comprising forming a third auxiliary layer in the second region between the first auxiliary layer and the second auxiliary layer.

8. The method of claim 7, wherein the forming of the third auxiliary layer comprises patterning the third auxiliary layer in the second region and not in the first and third regions.

9. The method of claim 7, wherein the third auxiliary layer comprises at least one selected from the group consisting of N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole), m-MTDATA, α-NPD, and TPD.

10. The method of claim 6,
    wherein the forming of the second electrode comprises:
       depositing the metal for forming the second electrode in the first, second, and third regions; and
       forming the second electrode in the second region, and
    wherein a thickness of the second electrode in the second region is less than a thickness of the second electrode in the first region.

11. The method of claim 6,
    wherein the forming of the third electrode comprises:
       depositing the metal for forming the third electrode in the first, second, and third regions; and
       forming the third electrode in the second region, and
    wherein a thickness of the third electrode in the second region is less than a thickness of the third electrode in the third region.

12. The method of claim 1, wherein the third electrode is formed thicker than the second electrode.

13. The method of claim 1, wherein adhesion of the second electrode in the second region is lower than adhesion of the second electrode in the first and third regions.

14. The method of claim 1, wherein adhesion of the third electrode in the first and second regions is lower than adhesion of the third electrode in the third region.

15. The method of claim 1, wherein the first auxiliary layer comprises at least one selected from the group consisting of tris(8-hydroxy-quinolinato)aluminum (Alq3), di-tungsten tetra(hexahydropyrimidopyrimidine), fullerene, lithium fluoride (LiF), 9,10-di(naphth-2-yl)anthracene (AND), and 8-hydroxyquinolinolato-lithium (Liq).

16. The method of claim 1, wherein the second auxiliary layer comprises at least one selected from the group consisting of N,N'-diphenyl-N,N'-bis(9-phenyl-9H-carbazol-3-yl) biphenyl-4,4'-diamine, N(diphenyl-4-yl)9,9-dimethyl-N-(4 (9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole), 4,4,4-tris(3-methylphenylphenylamino)triphenylamine (m-MTDATA), N,N'-bis(1-naphthyl)-N,N'-diphenyl[1,1'-biphenyl]-4,4'-diamine (α-NPD), and 4,4'-Bis[N-(3-methylphenyl)-N-phenylamino]biphenyl (TPD).

17. The method of claim 1, wherein the metal for forming the second electrode and the metal for forming the third electrode comprise magnesium (Mg).

* * * * *